US010162016B2

(12) United States Patent
Gabrys et al.

(10) Patent No.: US 10,162,016 B2
(45) Date of Patent: Dec. 25, 2018

(54) REDUCTION OF MAGNETIC SENSOR COMPONENT VARIATION DUE TO MAGNETIC MATERIALS THROUGH THE APPLICATION OF MAGNETIC FIELD

(71) Applicant: Texas Instruments Incorporated, Dallas, TX (US)

(72) Inventors: Ann Margaret Gabrys, Woodside, CA (US); Dok Won Lee, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/064,579

(22) Filed: Mar. 8, 2016

(65) Prior Publication Data
US 2017/0261564 A1    Sep. 14, 2017

(51) Int. Cl.
*G01R 33/00* (2006.01)
*G01R 33/04* (2006.01)
*G01R 33/09* (2006.01)
*G01R 33/07* (2006.01)

(52) U.S. Cl.
CPC .......... *G01R 33/0017* (2013.01); *G01R 33/04* (2013.01); *G01R 33/07* (2013.01); *G01R 33/09* (2013.01)

(58) Field of Classification Search
CPC .......... H01L 43/12; G01R 33/04; G01R 33/07
See application file for complete search history.

(56) References Cited

U.S. PATENT DOCUMENTS

| 6,396,975 B1 | 5/2002 | Wood et al. |
| 6,716,642 B1 | 4/2004 | Wu et al. |
| 2006/0237823 A1 | 10/2006 | Spielberger et al. |
| 2009/0261691 A1* | 10/2009 | Maeda ............... B81B 7/0048 310/348 |
| 2011/0281375 A1* | 11/2011 | Swaminathan ......... H01L 24/11 438/3 |

(Continued)

FOREIGN PATENT DOCUMENTS

| EP | 2944998 A1 | 11/2015 |
| WO | 2007107892 A1 | 9/2007 |

(Continued)

OTHER PUBLICATIONS

Notification of Transmittal of the International Search Report and the Written Opnion of the International Searching Authority, or the Declaration; dated Jul. 13, 2017.

*Primary Examiner* — Noam Reisner
(74) *Attorney, Agent, or Firm* — Jacqueline J. Garner; Charles A. Brill; Frank D. Cimino

(57) ABSTRACT

A microelectronic device, possibly a packaged microelectronic device, contains a magnetic sensor component and magnetizable structural features. Magnetic moments of the magnetizable structural features are aligned parallel to each other. The microelectronic device is formed by applying a magnetic field so as to align magnetic moments of the magnetizable structural features with the applied magnetic field. Application of the magnetic field is subsequently discontinued. The magnetic moments of the magnetizable structural features remain aligned parallel to each other after the applied magnetic field is discontinued.

15 Claims, 6 Drawing Sheets

(56) References Cited

U.S. PATENT DOCUMENTS

| | | | |
|---|---|---|---|
| 2012/0081111 A1* | 4/2012 | Kim | G01R 33/091 324/252 |
| 2013/0154034 A1* | 6/2013 | Apalkov | H01L 43/08 257/421 |
| 2014/0035570 A1* | 2/2014 | Jin | G01R 33/0005 324/252 |
| 2016/0273524 A1* | 9/2016 | Keidar | B64G 1/406 |
| 2017/0030981 A1* | 2/2017 | Lynde | G01R 33/0094 |

FOREIGN PATENT DOCUMENTS

| | | |
|---|---|---|
| WO | 2009007797 A1 | 1/2009 |
| WO | 2009040712 A2 | 2/2009 |
| WO | 2010012169 A1 | 2/2010 |

\* cited by examiner

REDUCTION OF MAGNETIC SENSOR COMPONENT VARIATION DUE TO MAGNETIC MATERIALS THROUGH THE APPLICATION OF MAGNETIC FIELD

FIELD

This disclosure relates to the field of microelectronic devices. More particularly, this disclosure relates to microelectronic devices containing magnetic sensor components.

BACKGROUND

Magnetic sensor components such as fluxgate magnetometer sensors may be integrated into microelectronic devices to reduce cost and system size. A parameter for magnetic sensor components is zero-field offset, which can be understood as a value of the parameter at an applied magnetic field of zero magnitude. Zero-field offset has been shown to be affected by the density and proximity of magnetizable structural features of the microelectronic device, such as nickel layers in bond pads. Conventional semiconductor processing techniques commonly produce randomly aligned magnetizable structural features, which increases overall zero-field offset variability. This may result in reduced accuracy and/or extra calibration costs of the magnetic sensor.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

A microelectronic device containing a magnetic sensor component and magnetizable structural features is formed by applying a magnetic field so as to align magnetic moments of the magnetizable structural features with the applied magnetic field. Application of the magnetic field is subsequently discontinued. The magnetic moments of the magnetizable structural features remain aligned after the applied magnetic field is discontinued.

DETAILED DESCRIPTION

Figure 1:
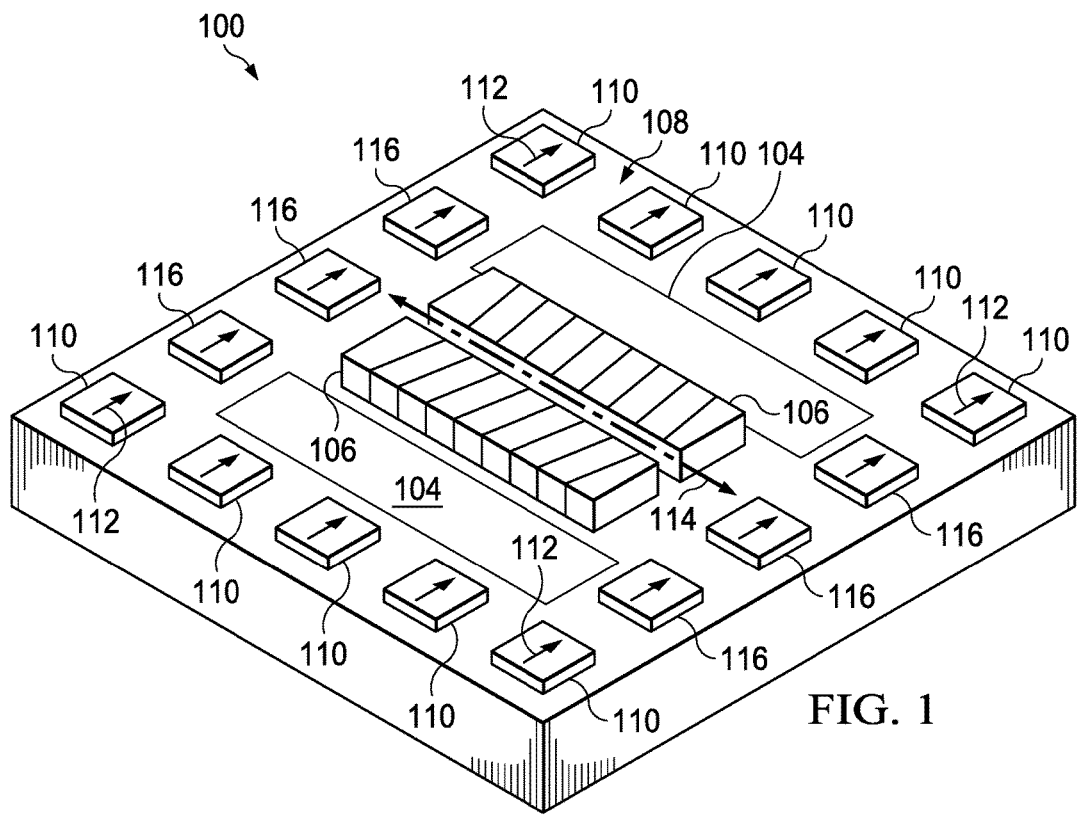
FIG. 1 depicts an example microelectronic device containing a magnetic sensor component and magnetizable structural features.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device contains a magnetic sensor component, such as a fluxgate magnetometer sensor, a Hall sensor, or a magnetoresistive sensor. The microelectronic device also contains magnetizable structural features, such as nickel layers or nickel alloy layers in bond pads, a seal ring or package leads. The magnetizable structural features have magnetic moments which contribute to a magnetic field at the magnetic sensor component.

The microelectronic device is formed by applying a magnetic field, aligning the magnetic moments of the magnetizable structural features to be substantially parallel with the applied magnetic field. Application of the magnetic field is subsequently discontinued, for example by removing the microelectronic device from the magnetic field or by turning off a source of the magnetic field. The magnetic moments of the magnetizable structural features remain aligned after the applied magnetic field is discontinued. The magnetic field which is applied to align the magnetic moments is significantly stronger than a stray field encountered in microelectronic device fabrication and handling, for example of at least 10 millitesla (mT). Aligning the magnetic moments of a plurality of similar microelectronic devices in a consistent orientation may advantageously reduce variation in zero-field offsets of the magnetic sensor components of the microelectronic devices.

The applied magnetic field may be oriented in a particular orientation so that the resulting magnetic moments of the magnetizable structural features provide a desirably low and/or desirably consistent zero-field offset of the magnetic sensor component. The particular orientation of the applied magnetic field to produce desired magnetic moments of the magnetizable structural features may be determined empirically and/or by calculations such as finite element modeling.

The magnetic field may be applied while the microelectronic device is part of a semiconductor wafer containing other similar devices. Alternatively, the magnetic field may be applied after the microelectronic device is assembled in a package such as a surface mount package.

FIG. 1 depicts an example microelectronic device containing a magnetic sensor component and magnetizable structural features. The microelectronic device 100 may be formed in and on a substrate 102 containing a semiconductor material. The substrate 102 may be, for example, a silicon substrate, silicon-on-insulator (SOI) substrate, or a silicon substrate with an epitaxial layer of semiconductor material. The substrate 102 may also include dielectric layers and interconnects over the semiconductor material of the substrate 102. The microelectronic device 100 includes circuitry 104 having active components such as transistors, formed in the substrate 102. The microelectronic device 100 further includes the magnetic sensor component 106, depicted in FIG. 1 as a differential fluxgate magnetometer core. The magnetic sensor component 106 may be formed in the substrate 102 or at a top surface 108 of the substrate 102, as depicted in FIG. 1. The circuitry 104 may provide signal conditioning for the magnetic sensor component 106.

The microelectronic device 100 includes the magnetizable structural features 110 containing magnetizable material such as nickel. The magnetizable structural features 110 are depicted in FIG. 1 as bond pads 110 containing nickel layers. The bond pads 110 provide electrical connections to the circuitry 104 and possibly directly to the magnetic sensor component 106. Other magnetizable structural features are within the scope of the instant example. Other magnetizable structural features may include, for example, nickel silicide layers in the circuitry 104 or in a seal ring around a perimeter of the substrate 102. Each of the magnetizable structural features 110 has a magnetic moment 112, depicted in FIG. 1 as an arrow denoting an orientation of the magnetic moment 112. The magnetic moments 112 are substantially parallel with each other in a predetermined orientation, as a result of an external magnetic field being applied to the microelectronic device 100. As a result, a zero-field offset of the magnetic sensor component 106 may be within a desired range, advantageously increasing accuracy of a system including the microelectronic device 100. The orientation of the magnetic moments 112 may be selected by adjusting an orientation of the applied magnetic field, so that a magnitude of the zero-field offset of the magnetic sensor component 106 may advantageously be minimized. For example, the orientation of the magnetic moments 112 may be parallel to the top surface 108 of the substrate 102, and perpendicular to a field measurement axis 114 of the fluxgate magnetometer core 106.

The microelectronic device 100 may optionally include dummy magnetizable structural features 116 which contain magnetizable material and are configured similar to the magnetizable structural features 110. The dummy magnetizable structural features 116 are not functional elements of the circuitry 104 of the microelectronic device 100, and may possibly be unconnected electrically to the circuitry 104. The dummy magnetizable structural features 116 are depicted in FIG. 1 as dummy bond pads 116. Other configurations of the dummy magnetizable structural features 116 are within the scope of the instant example. The dummy magnetizable structural features 116 also have the magnetic moments 112, oriented parallel to the magnetic moments 112 of the magnetizable structural features 110. The purpose of the dummy magnetizable structural features 116 is to further reduce the magnitude and/or variation of the zero-field offset of the magnetic sensor component 106, for example by providing a symmetric arrangement of the magnetic moments 112 of the combined magnetizable structural features 110 and the dummy magnetizable structural features 116.

Figure 2:
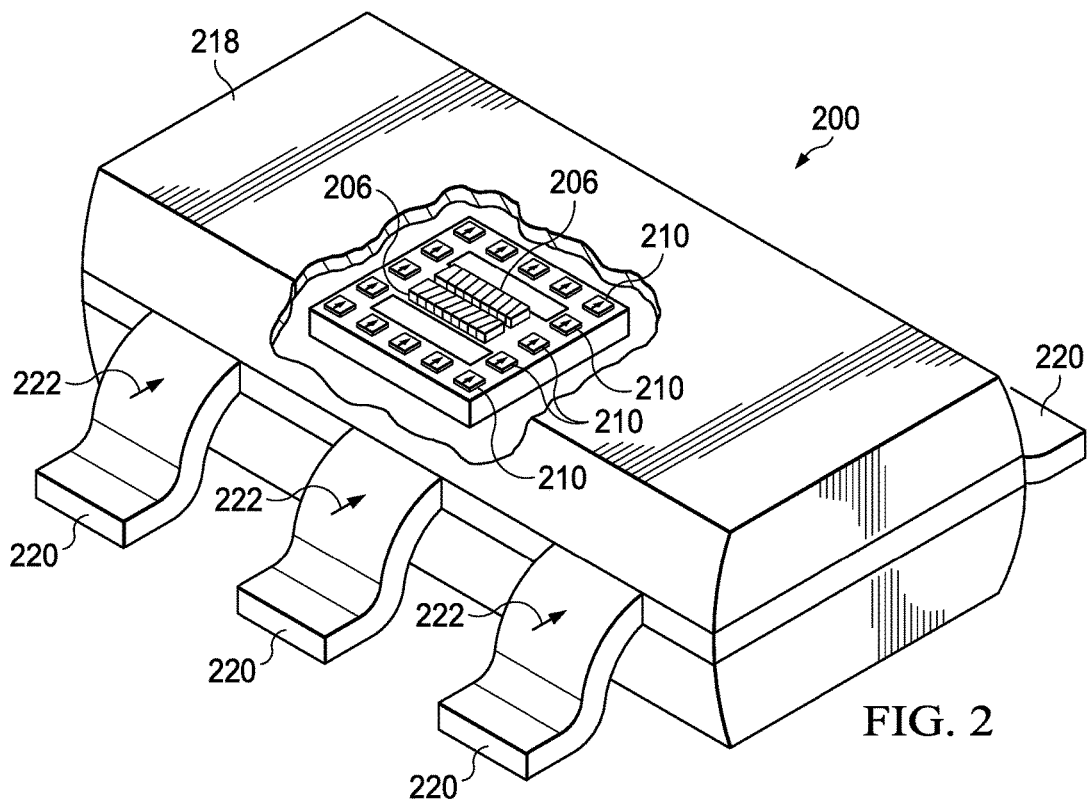
FIG. 2 depicts an example microelectronic device containing a magnetic sensor component, assembled in a package.

FIG. 2 depicts another example microelectronic device containing a magnetic sensor component. In the instant example, the microelectronic device 200 includes a magnetic sensor component 206 in a package 218, depicted in FIG. 2 as a surface mount package 218. There may be active circuitry integrated with the magnetic sensor component 206, as described in reference to FIG. 1. Alternatively, there may be active circuitry in the package 218, separate from a substrate on which the magnetic sensor component 206 is disposed. In the instant example, the package 218 includes magnetizable structural features 220 such as leads or terminals containing iron or nickel. Each of the magnetizable structural features 220 has a magnetic moment 222, depicted in FIG. 2 as an arrow denoting an orientation of the magnetic moment 222. The magnetic moments 222 are substantially parallel with each other in a predetermined orientation, as a result of an external magnetic field being applied to the microelectronic device 200 after it is assembled in the package 218. As a result, a zero-field offset of the magnetic sensor component 206 may be within a desired range. The orientation of the magnetic moments 222 may be selected by adjusting an orientation of the applied magnetic field, so that a magnitude of the zero-field offset of the magnetic sensor component 206 may advantageously be minimized.

In one version of the instant example, the microelectronic device 200 may contain additional magnetizable structural features 210, depicted in FIG. 2 as bond pads 210, with magnetic moments which are aligned parallel with each other, such as described in reference to FIG. 1. The magnetic moments of the bond pads 210 may optionally be aligned prior to aligning the magnetic moments 222 of the magnetizable structural features 220 of the package 218. Alternatively, the magnetic moments of the bond pads 210 may be aligned concurrently with the magnetic moments 222 of the magnetizable structural features 220 of the package 218.

Figure 3A:
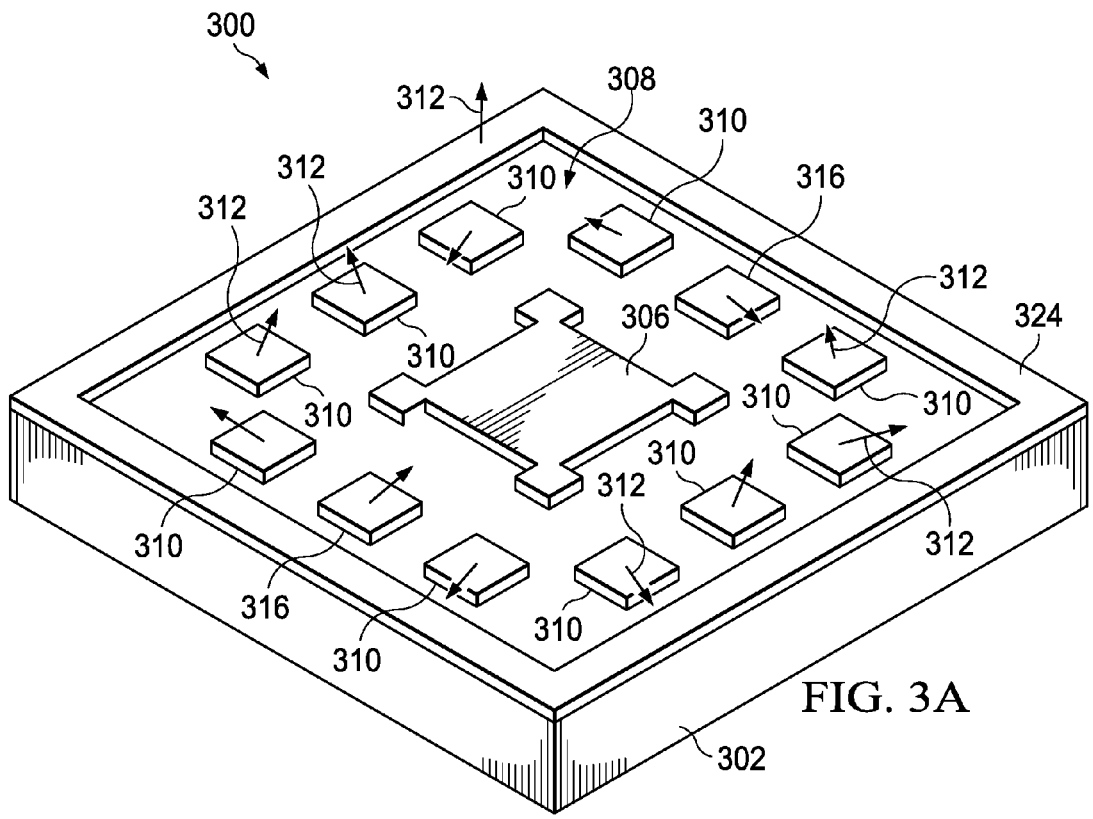
FIG. 3A and FIG. 3B depict a microelectronic device containing a magnetic sensor component and magnetizable structural features, in an example method of aligning magnetic moments of the magnetizable structural features.
Figure 3B:
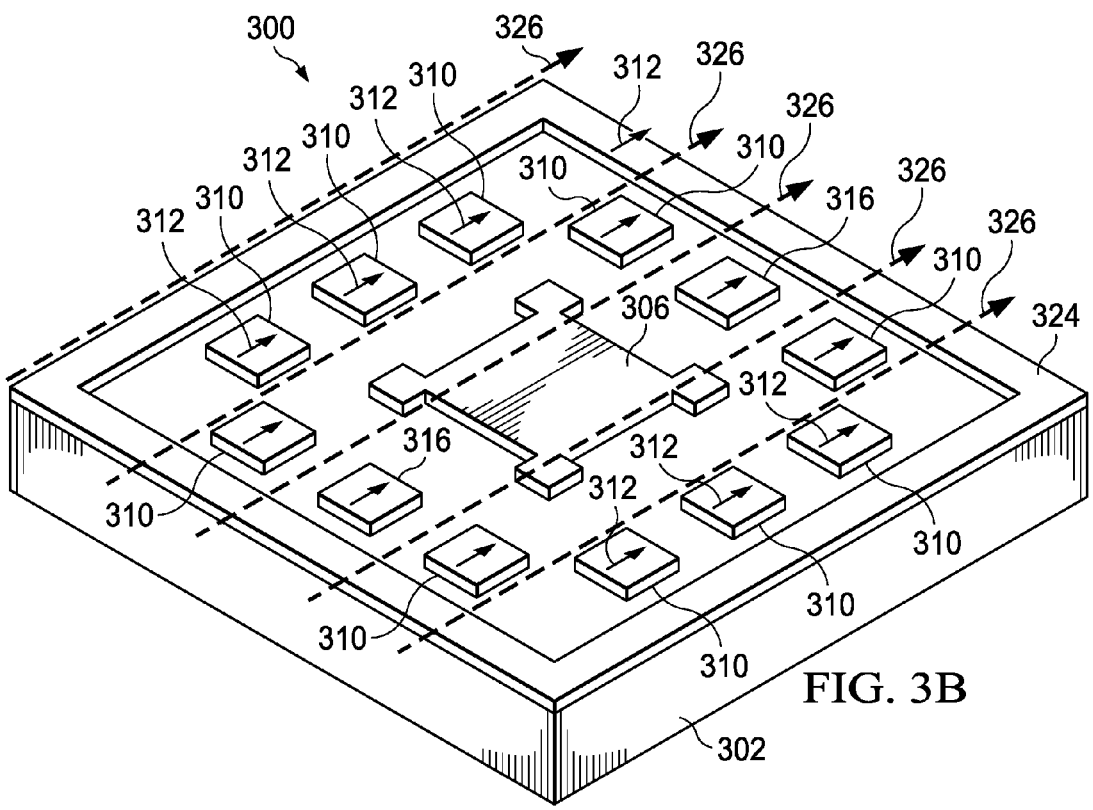

FIG. 3A and FIG. 3B depict a microelectronic device containing a magnetic sensor component and magnetizable structural features, in an example method of aligning magnetic moments of the magnetizable structural features. Referring to FIG. 3A, the microelectronic device 300 may be formed in and on a substrate 302 containing a semiconductor material, for example as described in reference to FIG. 1. The microelectronic device 300 includes circuitry 304 having active components such as transistors. The microelectronic device 300 further includes the magnetic sensor component 306, depicted in FIG. 3A as a Hall plate. The magnetic sensor component 306 may be disposed at a top surface 308 of the substrate 302, as depicted in FIG. 3A.

The microelectronic device 300 includes the magnetizable structural features containing magnetizable material. The magnetizable structural features are depicted in FIG. 3A as bond pads 310 and a seal ring 324 around a perimeter of the substrate 302 over the top surface 308. In the instant example, the bond pads 310 and the seal ring 324 contain nickel layers. Other magnetizable structural features are within the scope of the instant example. The microelectronic device 300 may optionally include dummy magnetizable structural features 316 which contain magnetizable material. Each of the magnetizable structural features 310, 324 and 316 has a magnetic moment 312, depicted in FIG. 3A as an arrow denoting an orientation of the magnetic moment 312. FIG. 3A depicts the microelectronic device 300 before the magnetic moments 312 are aligned; the magnetic moments 312 have random orientations and magnitudes.

Referring to FIG. 3B, a magnetic field 326 of sufficient strength, depicted in FIG. 3B by arrows 326 indicating an orientation of the magnetic field 326, is applied to the microelectronic device 300, aligning the magnetic moments 312 of the magnetizable structural features 310, 324 and 316 parallel to the magnetic field 326. The magnetic field 326 of is significantly stronger than a stray field encountered in microelectronic fabrication and handling. Experiments done in pursuit of the instant example have shown that a magnetic field of at least 10 mT is sufficient.

The magnetic field 326 may be applied by inserting the microelectronic device 300 into a region in which the magnetic field 326 is already extant. Alternatively, the magnetic field 326 may be applied by generating the magnetic field 326 using electric currents while the microelectronic device 300 is disposed in a region for the magnetic field 326. The magnetic field 326 is applied for a sufficient time so that the magnetic moments 312 remain oriented parallel to each other after application of the magnetic field 326 is discontinued. Experiments done in pursuit of the instant example have shown that applying the magnetic field 326 at room temperature for at least 60 seconds is sufficient. Application of the magnetic field 326 may be discontinued by removing the microelectronic device 300 from the region in which the magnetic field 326 remains extant. Alternatively, application of the magnetic field 326 may be discontinued by turning off electric currents used to generate the magnetic field 326 while the microelectronic device 300 is disposed in the region for the magnetic field 326. After application of the magnetic field 326 is discontinued, the magnetic moments 312 remain oriented parallel to each other, accruing the advantages disclosed in reference to FIG. 1.

Figure 4A:
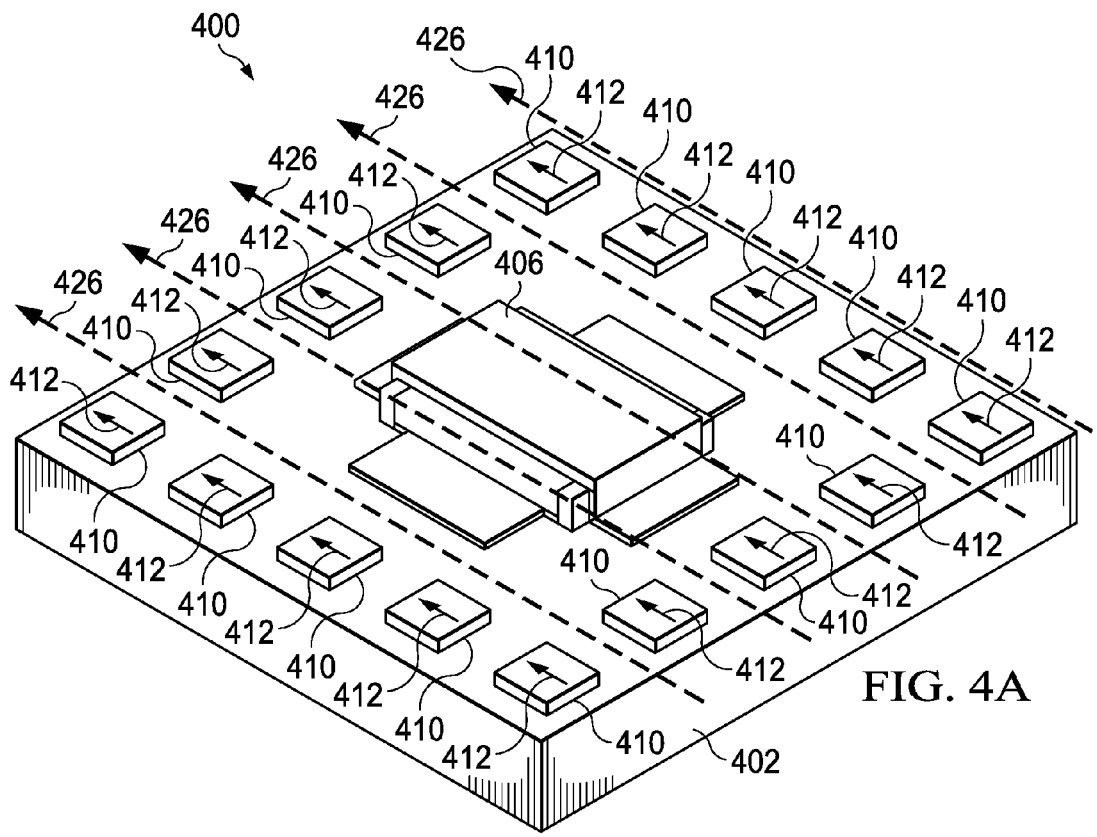
FIG. 4A and FIG. 4B depict an example method of estimating a desired orientation for a magnetic field applied to a microelectronic device containing a magnetic sensor component and magnetizable structural features.
Figure 4B:
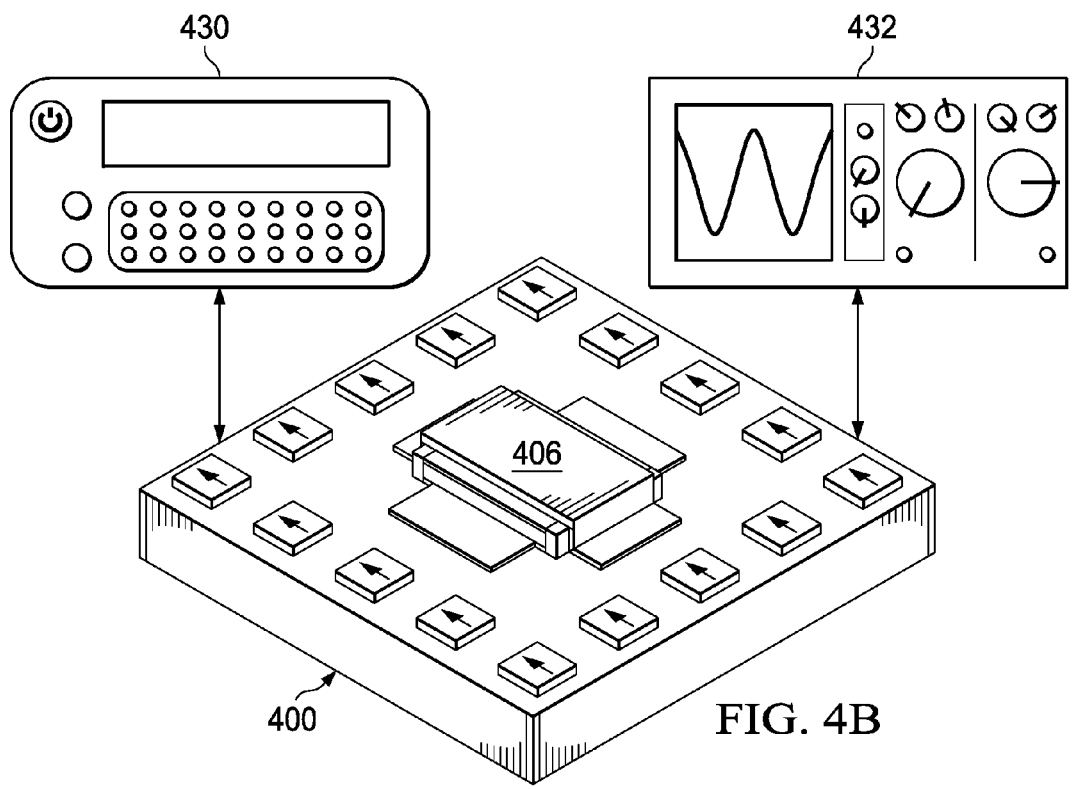

FIG. 4A and FIG. 4B depict an example method of estimating a desired orientation for a magnetic field applied to a microelectronic device containing a magnetic sensor component and magnetizable structural features. Referring to FIG. 4A, the microelectronic device 400 may be a test device, or may be a deliverable device, that is a device that will subsequently be sold. In one version of the instant example in which the microelectronic device 400, is a test device, the microelectronic device 400 may be structurally similar to, or substantially identical to, a deliverable device, possibly as a result of being formed concurrently with the deliverable device or being formed using a same process sequence as the deliverable device. The microelectronic device 400 may be formed in and on a substrate 402 containing a semiconductor material, for example as described in reference to FIG. 1. The microelectronic device 400 includes a magnetic sensor component 406, depicted in FIG. 4A as a magnetoresistive sensor, for example, an anisotropic magnetoresistive (AMR) sensor, a giant magnetoresistive (GMR) sensor, or a tunneling magnetoresistive (TMR) sensor. The microelectronic device 400 includes magnetizable structural features 410, depicted in FIG. 4A as bond pads 410, containing magnetizable material. The microelectronic device 400 may optionally include circuitry, not shown in FIG. 4A. The microelectronic device 400 may include dummy magnetizable structural features, not shown in FIG. 4A. Each of the magnetizable structural features 410 has a magnetic moment 412, depicted in FIG. 4A as an arrow denoting an orientation of the magnetic moment 412.

A test magnetic field 426 with a test orientation and test strength is applied to the microelectronic device 400. The magnetic moments 412 of the magnetizable structural features 410 are aligned parallel to each other by the test magnetic field 426. The magnetic moments 412 may be substantially parallel to the test magnetic field 426. The test magnetic field 426 may be applied as described in reference to FIG. 3B, for example. Application of the test magnetic field 426 is subsequently discontinued. The magnetic moments 412 remain aligned parallel to each other after the test magnetic field 426 is discontinued.

Referring to FIG. 4B, the magnetic sensor component 406 is evaluated to determine values of one or more parameters of the magnetic sensor component 406, such as zero-field offset. The magnetic sensor component 406 may be evaluated by test equipment, depicted in FIG. 4B as a signal generator 430 and oscilloscope 432, which are electrically coupled to the microelectronic device 400.

A desired orientation for a magnetic field applied to the deliverable device is estimated from the values of the parameters of the magnetic sensor component 406 of the microelectronic device 400. The steps disclosed in reference to FIG. 4A and FIG. 4B may be repeated to obtain a range of the values of the parameters of the magnetic sensor component 406. The steps disclosed in reference to FIG. 4A and FIG. 4B may be repeated using different orientations and strengths of the test magnetic field 426, to enable a more accurate estimate of the desired orientation for the magnetic field applied to the deliverable device. A plurality of microelectronic devices, similar to the microelectronic device 400 may be used in repetitions of the steps disclosed in reference to FIG. 4A and FIG. 4B, to enable a more accurate estimate of the desired orientation for the magnetic field applied to the deliverable device.

Figure 5:
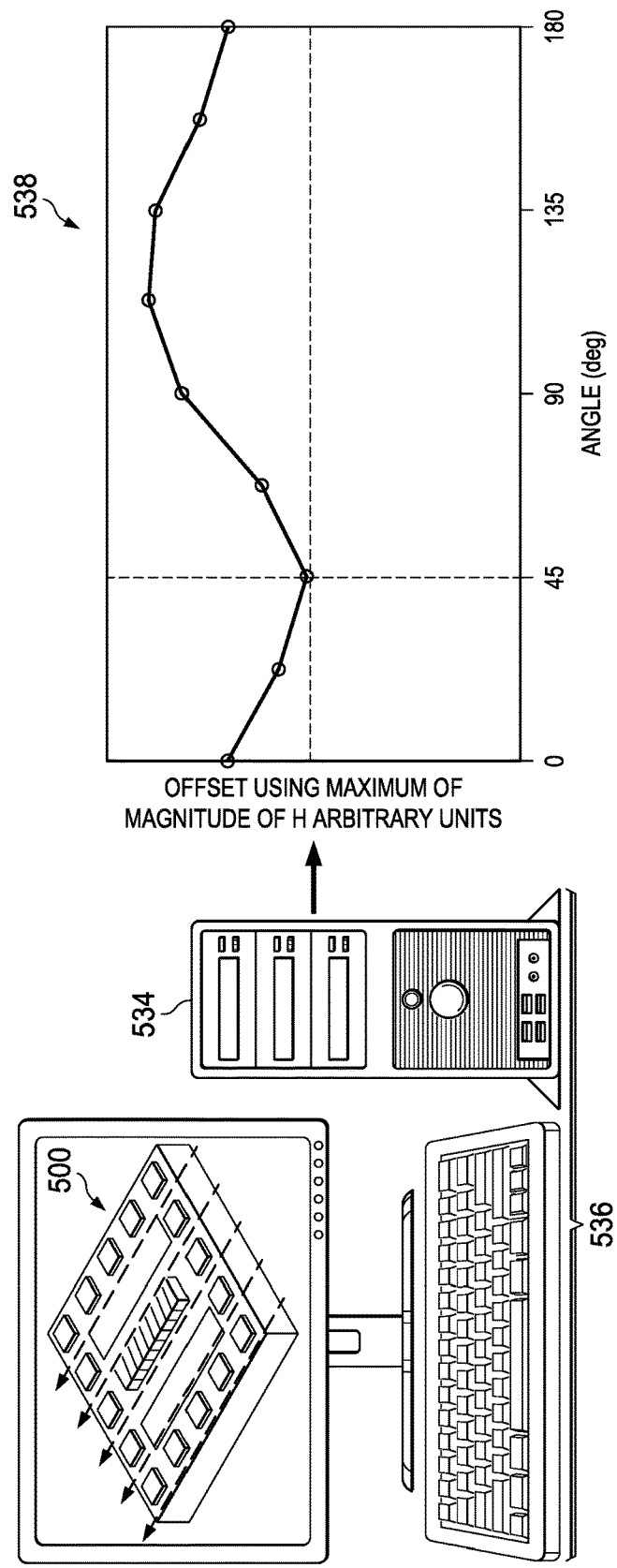
FIG. 5 depicts another example method of estimating a desired orientation for a magnetic field applied to a microelectronic device containing a magnetic sensor component and magnetizable structural features.

FIG. 5 depicts another example method of estimating a desired orientation for a magnetic field applied to a microelectronic device containing a magnetic sensor component and magnetizable structural features. The microelectronic device 500 contains the magnetic sensor component, depicted in FIG. 5 as a single core fluxgate magnetometer. The microelectronic device 500 may alternatively be similar to the microelectronic devices described in reference to any of the examples disclosed herein.

In the instant example, magnetic properties of the microelectronic device 500, including the magnetizable structural features, are retrieved from a computer-readable memory unit 534, and are used in a computer program running on a computer 536 to estimate values of one or more parameters, such as zero-field offset, of the magnetic sensor component, as functions of corresponding values of orientation and strength of a magnetic field applied to the microelectronic device. The computer program includes instructions and possibly data values stored in one or more computer-readable memory components of the computer 536. The microelectronic device 500 is depicted in FIG. 5 as an image on a monitor of a computer 536. In one version of the instant example, the microelectronic device 500 may be formed and measured to provide values of the magnetic properties stored in the computer-readable memory unit 534. In an alternate version, the magnetic properties may be estimated without forming the microelectronic device 500. A relationship between the estimated parameter values and the corresponding values of orientation and strength of a magnetic field is depicted as a chart 538 produced by the computer program. A desired orientation for a magnetic field applied to the microelectronic device 500 is estimated from the estimated parameter values and the corresponding values of orientation and strength of a magnetic field.

Figure 6:
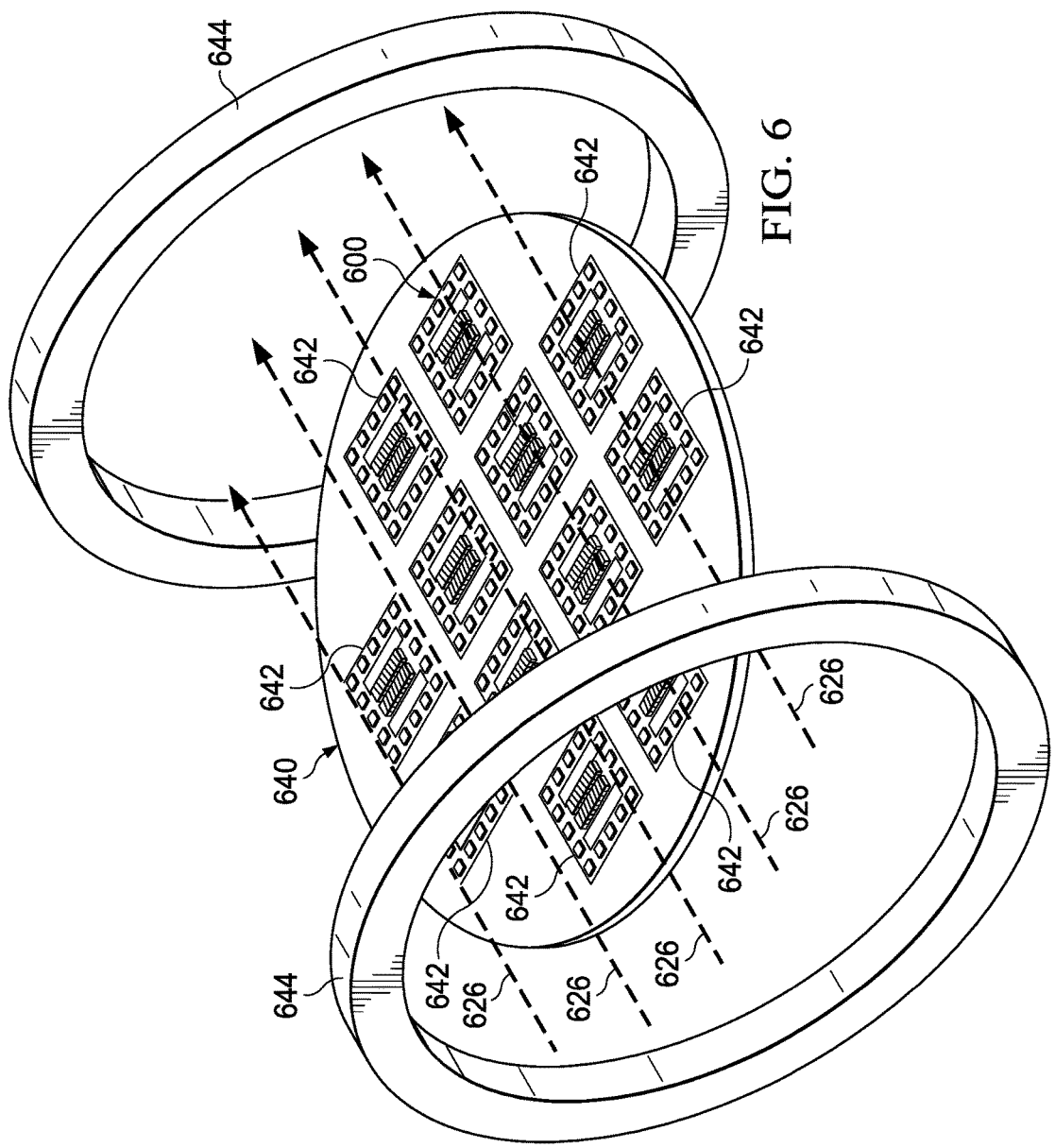
FIG. 6 depicts an example method of applying a magnetic field to a microelectronic device containing a magnetic sensor component and magnetizable structural features.

FIG. 6 depicts an example method of applying a magnetic field to a microelectronic device containing a magnetic sensor component and magnetizable structural features. In the instant example, the microelectronic device 600 is included in a substrate wafer 640 comprising a semiconductor material. A plurality of other microelectronic devices 642 with magnetic sensor components and magnetizable structural features are included in the substrate wafer 640. The microelectronic device 600 may be similar to the microelectronic devices described in the example herein. The substrate wafer 640 may be, for example, a bulk silicon wafer, an SOI wafer, or a silicon wafer with an epitaxial layer of semiconductor material. The substrate wafer 640 may also include dielectric layers and interconnects over the semiconductor material. The other microelectronic devices 642 may be substantially identical to the microelectronic device 600, as a result of being formed concurrently and having a same design.

A sufficiently strong magnetic field 626, for example at least 10 mT, depicted in FIG. 6 by arrows 626 indicating an orientation of the magnetic field 626, is applied to the microelectronic device 600 and the other microelectronic devices 642 while in the substrate wafer 640. Application of the magnetic field 626 causes magnetic moments of the magnetizable structural features in the microelectronic device 600 and the other microelectronic devices 642 to be aligned parallel to the magnetic field 626. The magnetic field 626 may be applied, for example, using Helmholtz coils 644. In actual practice, the Helmholtz coils 644 may be significantly larger than the substrate wafer 640 to provide a desired uniformity of the magnetic field 626. The magnetic field 626 may be applied by providing current through the Helmholtz coils 644 to form the magnetic field 626 and subsequently inserting the substrate wafer 640 into a region between the Helmholtz coils 644. Alternatively, the magnetic field 626 may be applied by disposing the substrate wafer 640 in the region between the Helmholtz coils 644 and subsequently generating the magnetic field 626 by providing current to the Helmholtz coils 644. The magnetic field 626 is applied for a sufficient time so that the magnetic moments of the magnetizable structural features in the microelectronic device 600 and the other microelectronic devices 642 remain aligned parallel to each other after application of the magnetic field 626 is discontinued. Application of the magnetic field 626 is subsequently discontinued, for example by removing the substrate wafer 640 from the region between the Helmholtz coils 644 or by turning off the current in the Helmholtz coils 644. Aligning the magnetic moments of the magnetizable structural features in the microelectronic device 600 and the other microelectronic devices 642 while in the substrate wafer 640 may advantageously reduce fabrication costs of the microelectronic device 600 and the other microelectronic devices 642.

Figure 7:
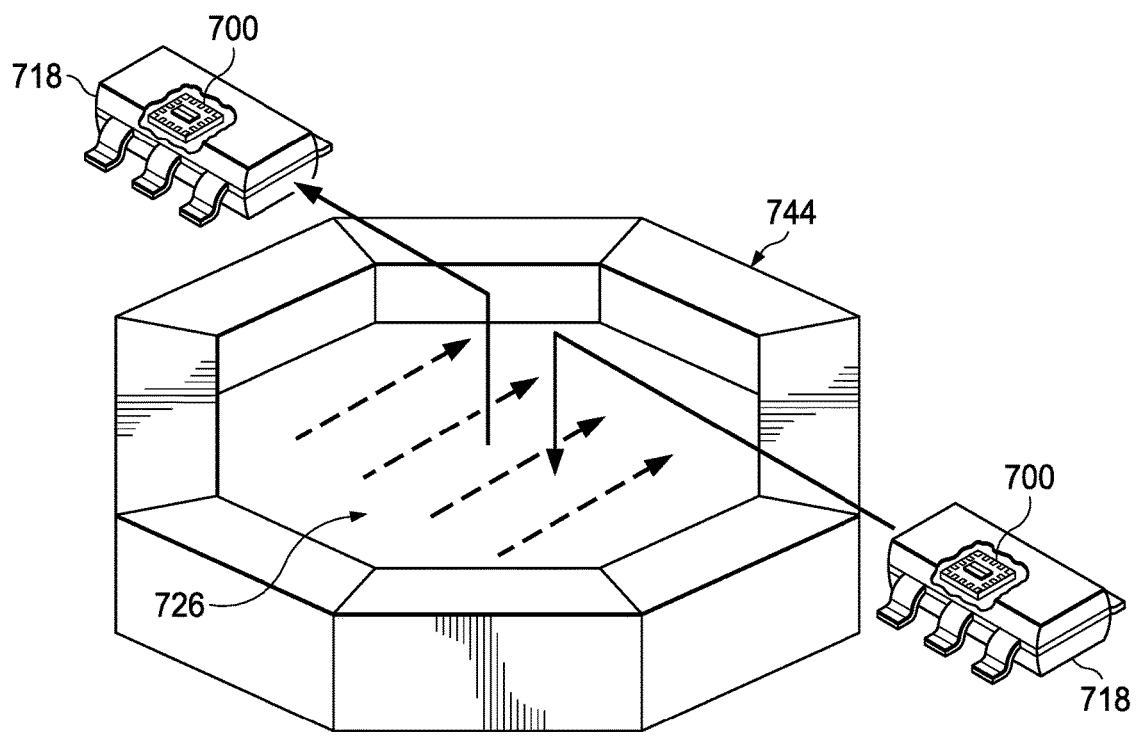
FIG. 7 depicts another example method of applying a magnetic field to a microelectronic device containing a magnetic sensor component and magnetizable structural features.

FIG. 7 depicts another example method of applying a magnetic field to a microelectronic device containing a magnetic sensor component and magnetizable structural features. In the instant example, the microelectronic device 702 is singulated, and possibly assembled in a package 718 as depicted in FIG. 7. The package 718 may include magnetizable structural features such as leads or terminals containing iron or nickel. A sufficiently strong magnetic field 726, for example at least 10 mT, depicted in FIG. 7 by arrows 726 indicating an orientation of the magnetic field 726, is applied to the microelectronic device 702 and the package 718. Application of the magnetic field 726 causes magnetic moments of the magnetizable structural features in the microelectronic device 702 and the package 718 to be aligned parallel to the magnetic field 726. The magnetic field 726 may be applied by inserting the microelectronic device 702 into a region in which the magnetic field 726 is already extant, for example into a Halbach device 744 as depicted in FIG. 7.

Alternatively, the magnetic field 726 may be applied by disposing the microelectronic device 702 in a region for the magnetic field 726 and subsequently generating the magnetic field 726 using electrical current sources. The magnetic field 726 is applied for a sufficient time so that the magnetic moments of the magnetizable structural features in the microelectronic device 702 and the package 718 remain aligned parallel to each other after application of the magnetic field 726 is discontinued. Application of the magnetic field 726 is subsequently discontinued, for example by removing the microelectronic device 702 from the magnetic field 726 or by turning off the magnetic field 726. Aligning the magnetic moments of the magnetizable structural features in the microelectronic device 702 and the package 718 concurrently may advantageously reduce fabrication costs of the packaged microelectronic device 702. Aligning the magnetic moments of the magnetizable structural features in the microelectronic device 702 and the package 718 concurrently may further provide low and consistent zero-field offset for microelectronic devices 702 fabricated in production lines lacking magnetization equipment.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method, comprising:
 applying a magnetic field greater than a stray magnetic field to magnetizable structural features of a microelectronic device that is part of a substrate wafer with other microelectronic devices, wherein the magnetizable structural features are separate from a magnetic sensor component of the microelectronic device, for a predetermined duration to align magnetic moments of the magnetizable structural features parallel to the magnetic field, wherein the magnetizable structural features comprise bond pads and wherein the magnetic sensor component includes a fluxgate magnetometer core; and
 discontinuing application of the magnetic field after the predetermined duration.

2. The method of claim 1, wherein the magnetic field is at least 10 millitesla (mT).

3. The method of claim 1, wherein the magnetizable material comprises nickel.

4. The method of claim 1, wherein the magnetic field is oriented parallel to a top surface of the substrate.

5. The method of claim 1, wherein the magnetic sensor component includes a magnetoresistive sensor.

6. The method of claim 1, wherein the magnetic field is oriented perpendicular to a field measurement axis of the magnetic sensor component.

7. The method of claim 1, wherein the magnetic field is applied using a Halbach device.

8. The method of claim 1, wherein the magnetic field is applied using electrical currents to generate the magnetic field.

9. The method of claim 8, wherein the magnetic field is applied using Helmholtz coils.

10. A method, comprising:
 applying a magnetic field greater than a stray magnetic field to magnetizable structural features of a microelectronic device that is part of a substrate wafer with other microelectronic devices, wherein the magnetizable structural features are separate from a magnetic sensor component of the microelectronic device, for a predetermined duration to align magnetic moments of the magnetizable structural features parallel to the magnetic field, wherein the magnetizable structural features comprise bond pads and wherein the magnetic sensor component includes a Hall plate; and discontinuing application of the magnetic field after the predetermined duration.

11. A method, comprising:

applying a magnetic field greater than a stray magnetic field to magnetizable structural features of a microelectronic device, wherein the magnetizable structural features are separate from a magnetic sensor component of the microelectronic device, for a predetermined duration to align magnetic moments of the magnetizable structural features parallel to the magnetic field;

discontinuing application of the magnetic field after the predetermined duration;

applying a test magnetic field to a second microelectronic device comprising a magnetic sensor component and magnetizable structural features;

subsequently measuring a value of a parameter of the magnetic sensor component of the second microelectronic device; and using the measured value of the parameter to estimate a desired orientation for the magnetic field applied to the second microelectronic device, prior to applying the magnetic field to the microelectronic device.

12. A method, comprising:

applying a magnetic field greater than a stray magnetic field to magnetizable structural features of a microelectronic device, wherein the magnetizable structural features are separate from a magnetic sensor component of the microelectronic device, for a predetermined duration to align magnetic moments of the magnetizable structural features parallel to the magnetic field;

discontinuing application of the magnetic field after the predetermined duration;

reading values of magnetic properties of the microelectronic device from a computer-readable memory;

estimating a value of a parameter of the magnetic sensor component as a function of a test orientation of the magnetic moments of the magnetizable structural features, using the values of the magnetic properties; and estimating a desired orientation for the magnetic field applied to the microelectronic device, using the estimated value of the parameter, prior to applying the magnetic field to the microelectronic device.

13. A method, comprising:

applying a magnetic field greater than a stray magnetic field to magnetizable structural features disposed in a package housing an active circuit and a fluxgate magnetometer core, for a predetermined duration to align magnetic moments of the magnetizable structural features parallel to the magnetic field for a selected zero-field offset of the fluxgate magnetometer core; and discontinuing application of the magnetic field after the predetermined duration.

14. The method of claim 13, wherein the magnetic field is at least 10 mT.

15. The method of claim 13, wherein the magnetizable structural features of the package comprise metal leads.

* * * * *